United States Patent
Fujii

(10) Patent No.: US 7,512,394 B2
(45) Date of Patent: Mar. 31, 2009

(54) WIDEBAND UP-CONVERSION MIXER

(75) Inventor: Kohei Fujii, San Jose, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 501 days.

(21) Appl. No.: 10/990,842

(22) Filed: Nov. 16, 2004

(65) Prior Publication Data

US 2006/0105736 A1    May 18, 2006

(51) Int. Cl.
*H04B 1/26* (2006.01)

(52) U.S. Cl. .................... 455/327; 455/333; 455/323; 455/324; 455/325; 327/76; 327/113; 327/333; 327/356; 327/359

(58) Field of Classification Search ........... 455/209, 455/302, 307, 323–333; 330/286, 306, 54; 327/76, 113, 333, 355, 356, 359
See application file for complete search history.

(56) References Cited

U.S. PATENT DOCUMENTS

| | | | | |
|---|---|---|---|---|
| 2,957,143 | A | * | 10/1960 | Enloe ..................... 330/306 |
| 4,540,954 | A | * | 9/1985 | Apel ...................... 330/286 |
| 4,564,817 | A | * | 1/1986 | Gilson et al. ............ 330/286 |
| 4,662,000 | A | * | 4/1987 | Tajima et al. ............ 455/333 |
| 4,675,911 | A | * | 6/1987 | Sokolov et al. .......... 455/325 |
| 4,751,744 | A | | 6/1988 | Pavio, Jr. |
| 4,896,374 | A | | 1/1990 | Waugh et al. |
| 4,994,755 | A | * | 2/1991 | Titus et al. .............. 330/54 |
| 5,027,163 | A | | 6/1991 | Dobrovolny |
| 5,136,720 | A | * | 8/1992 | Titus et al. .............. 455/323 |
| 5,444,399 | A | | 8/1995 | Shiga |

(Continued)

FOREIGN PATENT DOCUMENTS

FR    2597680 A1 * 10/1987

OTHER PUBLICATIONS

Maas, Stephen A., A GaAs MESFET Mixer with Very Low Intermodulation, IEEE Transactions on Microwave Theory and Technique, vol. MTT-35, No. 4, Apr. 1987, pp. 425-429.

(Continued)

*Primary Examiner*—Edward Urban
*Assistant Examiner*—Junpeng Chen

(57) ABSTRACT

An up-conversion mixer includes a first and a second hybrid couplers and a first and a second traveling-wave mixers is disclosed. The first hybrid coupler receives an input intermediate frequency (IF) signal and produces a first IF signal (IF1) and a second IF (IF2) signal, the second IF signal being 180 degree off-phase compared to the first IF signal. The first traveling-wave mixer mixes the first IF signal (IF1) and a first local oscillator (LO1) signal to produces a first radio frequency signal (RF1). The second traveling-wave mixer mixes the second IF signal (IF2) and a second local oscillator signal (LO2) to produces a second RF signal (RF2). The second hybrid coupler to combines the first RF signal and the second RF signal to produce an output RF signal. The use of the traveling-wave mixers allow for a wide bandwidth operation of the up-conversion mixer.

12 Claims, 12 Drawing Sheets

U.S. PATENT DOCUMENTS

| | | |
|---|---|---|
| 5,528,769 A | 6/1996 | Berenz et al. |
| 5,809,409 A | 9/1998 | Itoh et al. |
| 5,950,119 A | 9/1999 | McGeehan et al. |
| 6,633,194 B2 | 10/2003 | Arnborg et al. |
| 6,643,417 B2 | 11/2003 | Strutz et al. |
| 6,674,808 B1 | 1/2004 | Griph et al. |
| 6,731,922 B1 | 5/2004 | Strutz et al. |
| 6,738,611 B1 | 5/2004 | Politi |
| 6,744,320 B2 | 6/2004 | Nguyen et al. |
| 6,850,748 B2 * | 2/2005 | Song et al. ............... 455/302 |
| 7,123,899 B1 * | 10/2006 | Chen et al. ............... 455/341 |

OTHER PUBLICATIONS

Henderson, Bert C. and Cook, James A., Image-Reject and Single-Sideband Mixers, 1985 Watkins-Johnson Company, Tech-note vol. 12 No. 3 May/Jun. 1985, Revised and reprinted 2001 WJ Communications, Inc., www.wj.com.

Ham, R.E., A Four Port Traveling Wave Mixer/Ampifier Using Single Gate MESFET'S, 88CH2571-8/99/0000-0655S1.00. 1988IEEE, pp. 655-959.

Maas, Stephen A., Microwave Mixers, Second Edition (artech House, Boston 1993), pp. 280-285.

* cited by examiner

WIDEBAND UP-CONVERSION MIXER

BACKGROUND

Electronic instrumentations or communication systems utilize various signal converting techniques to increase or decrease frequencies of electronics signals. For example, a wireless communication device such as a cellular telephone communicates with a base station using microwave or radio frequencies (RF) in the order of hundreds of MHz, tens of GHz, or even higher. However, within the communication device, the RF signal is converted to an intermediate frequency (IF) signal for processing.

To receive information from the base station, the communication device receives RF signal (encoding the information) from the base station. The frequency of the RF signal can be, for example, 10 GHz. Within the communication device, the RF signal is down-converted to IF signal (while preserving the encoded information). Frequency of the IF signal is typically lower than the frequency of the RF signal and can be, for example, 1 GHz. The down-conversion is realized using an image rejection mixer (IRM). Then, the IF signal is further processed to extract the information.

To transmit information to the base station, the communication device encodes the information on IF signal of, for example, 1 GHz. Then, the IF signal is up-converted to RF signal (while preserving the encoded information and rejecting a local oscillator signal) of, for example, 10 GHz. The up-conversion is realized using a local oscillator signal rejection up-conversion mixer also refereed to as a local oscillator signal rejection mixer or an up-conversion mixer.

The image rejection down-conversion mixer (the image rejection mixer, IRM) and the up-conversion mixer (UPM) of the communication device is typically optimized to operate at a particular RF and IF frequencies. For example, the IRM can be designed to convert 10 GHz RF signal to 1 GHz IF signal, and the UPM can be designed to convert 1 GHz IF signal to 10 GHz RF signal.

In the current IRM and UPM designs, efficiency of operation of the mixers depends heavily on the operating frequency. In fact, a typical single-ended FET mixer-based IRM or a UPM has a relatively narrow bandwidth of approximately 10 percent of its designed frequency. That is, for example, a typical single-ended FET mixer-based IRM designed to operate with a 10 GHz input RF signal and 9 GHz local oscillator (LO) signal has acceptable efficiencies of operation with an input RF signal having frequency ranging from approximately 9.5 to 10.5 GHz for RF signal and 8.5 to 9.5 GHz for LO signal. Outside these frequency ranges, the IRM is too inefficient for practical use.

Likewise, a typical single-ended FET mixer-based UPM designed to operate with a 1 GHz input IF signal and 10 GHz output RF signal has acceptable efficiencies of operation with an input IF signal having frequency ranging from approximately 950 to 1050 MHz and output RF signal of 9.5 to 10.5 GHz. Outside this frequency ranges, the UPM is too inefficient for practical use.

Efficiency of a mixer such as the IRM and the UPM is calculated as conversion loss ratio. The conversion loss ratio is a ratio of the amplitude (representing the power or strength) of its output signal to the amplitude (representing the power or strength) of its input signal.

In some applications such as for instrumentation or electrical warfare (EW) applications, it is desirable for a mixer (down-conversion or up-conversion) to have high efficiency of operation for a wide range of input frequencies, or wide bandwidth. The present mixer designs (IRM and UPM) with its narrow bandwidth are not suitable for these applications. There is a need for wider bandwidth conversion mixers.

SUMMARY

The need is met by the present invention. In a first embodiment of the present invention, an up-conversion mixer includes a first hybrid coupler, a second hybrid coupler, a first traveling-wave mixer, and a second traveling-wave mixer. The first hybrid coupler is adapted to receive an input intermediate frequency (IF) signal and to produce a first IF signal (IF1) and a second IF (IF2) signal, the second IF signal being 180 degree off-phase compared to the first IF signal. The first traveling-wave mixer is adapted to mix the first IF signal (IF1) and a first local oscillator (LO1) signal to produce a first radio frequency signal (RF1). The second traveling-wave mixer adapted to receive the second IF signal (IF2) and a second local oscillator signal (LO2) to produce a second RF signal (RF2). The second hybrid coupler is adapted to combine the first RF signal and the second RF signal to produce an output RF signal.

In a second embodiment of the present invention, an apparatus includes a first hybrid coupler and a monolithic microwave integrated circuit (MMIC). The MMIC includes a second hybrid coupler, a first traveling-wave mixer, and a second traveling-wave mixer. The first hybrid coupler is adapted to receive an input intermediate frequency (IF) signal and to produce a first IF signal (IF1) and a second IF (IF2) signal, the second IF signal being 180 degree off-phase compared to the first IF signal. The first traveling-wave mixer is adapted to mix the first IF signal (IF1) and a first local oscillator (LO1) signal to produce a first radio frequency signal (RF1). The second traveling-wave mixer adapted to receive the second IF signal (IF2) and a second local oscillator signal (LO2) to produce a second RF signal (RF2). The second hybrid coupler is adapted to combine the first RF signal and the second RF signal to produce an output RF signal.

Other aspects and advantages of the present invention will become apparent from the following detailed description, taken in conjunction with the accompanying drawings, illustrating by way of example the principles of the invention.

DETAILED DESCRIPTION

I. Introduction

Figure 1:
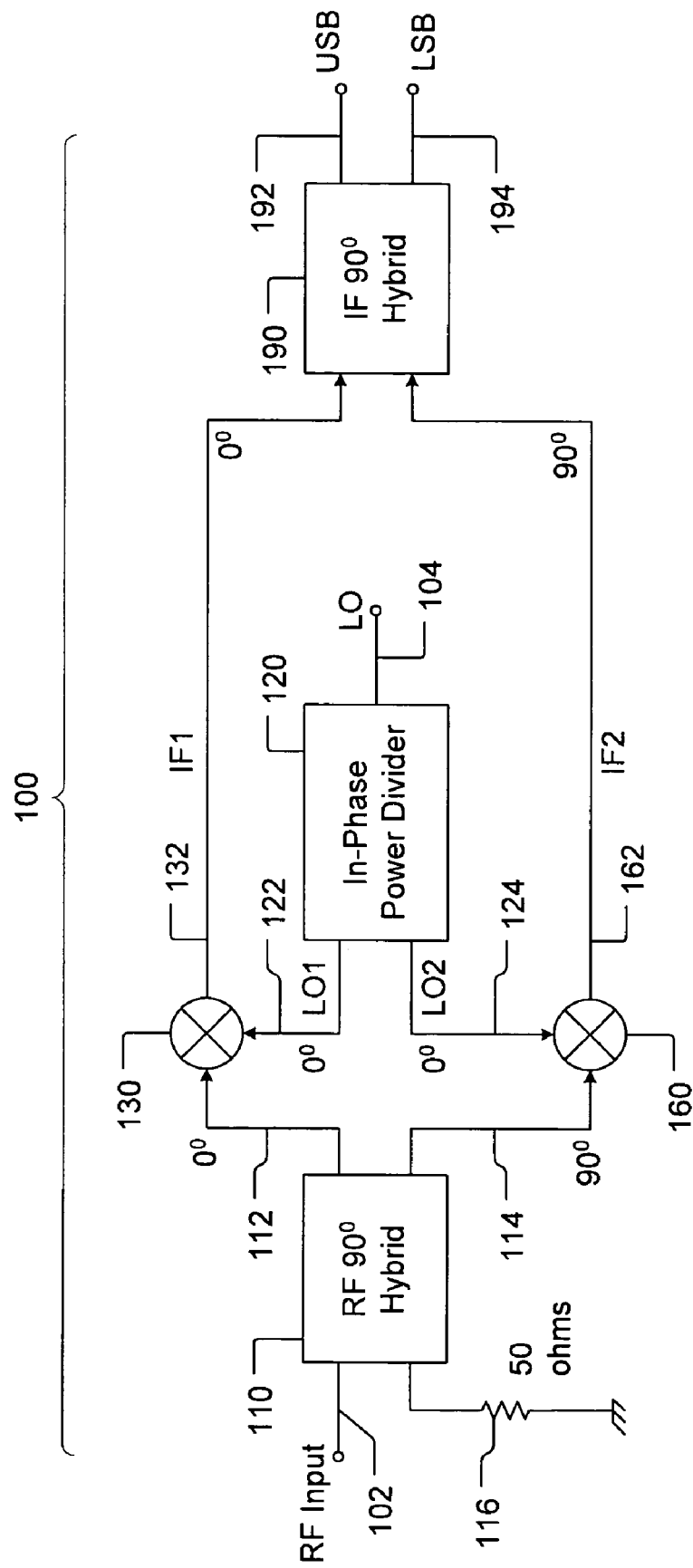
FIG. 1 is a block diagram of a prior art image rejection mixer.

The present invention will now be described with reference to the Figures which illustrate various embodiments of the present invention. In the Figures, some sizes of structures or portions may be exaggerated and not to scale relative to sizes of other structures or portions for illustrative purposes and, thus, are provided to illustrate the general structures of the present invention. Furthermore, various aspects of the present invention are described with reference to a structure or a portion positioned "on" or "above" relative to other structures, portions, or both. Relative terms and phrases such as, for example, "on" or "above" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "on" or "above" other structures or portions would now be oriented "below," "under," "left of," "right of," "in front of," or "behind" the other structures or portions. References to a structure or a portion being formed "on" or "above" another structure or portion contemplate that additional structures or portions may intervene. References to a structure or a portion being formed on or above another structure or portion without an intervening structure or portion are described herein as being formed "directly on" or "directly above" the other structure or the other portion. Same reference number refers to the same elements throughout this document.

In a first embodiment of the present invention, an up-conversion mixer includes a first hybrid coupler, a second hybrid coupler, a first traveling-wave mixer, and a second traveling-wave mixer. The first hybrid coupler is adapted to receive an input intermediate frequency (IF) signal and to produce a first IF signal (IF1) and a second IF (IF2) signal, the second IF signal being 180 degree off-phase compared to the first IF signal. The first traveling-wave mixer is adapted to mix the first IF signal (IF1) and a first local oscillator (LO1) signal to produce a first radio frequency signal (RF1). The second traveling-wave mixer adapted to receive the second IF signal (IF2) and a second local oscillator signal (LO2) to produce a second RF signal (RF2). The second hybrid coupler is adapted to combine the first RF signal and the second RF signal to produce an output RF signal.

The traveling-wave mixers present relatively constant 50 ohm input impedance to a wide range of frequencies for the input IF signal and the LO signal. Further, the traveling-wave mixers present relatively constant 50 ohm output impedance to a wide range of frequencies of the input RF signal. For this reason, the up-conversion mixer of the present invention is able to operate efficiently for a wider range of frequencies of both the input IF signal, the input LO signal, and the output RF. In short, the up-conversion mixer of the present invention is a wide bandwidth mixer more suitable for instrumentation or electrical warfare (EW) applications than a conventional image rejection down-conversion mixer.

II. Conventional Image Rejection Down-Conversion Mixer

FIG. 1 is a block diagram of a conventional image reject down-conversion mixer 100. An input RF signal 102 is introduced to a first hybrid coupler 110. The input RF signal 102 can be, for example, a 10 GHz signal and may range from hundreds of MHz to many tens of GHz. For the present invention, radio frequency (RF) may range from hundreds of MHz to many tens of GHz. The first hybrid coupler 110 is a passive RF quadrature device that divides the input RF signal 102 to a first RF signal 112 and a second RF signal 114, the second RF signal 114 being in quadrature compared to the first RF signal 112. The first hybrid coupler 110 is terminated to ground by a 50 ohm terminating resistor 116. In the illustrated example, the first RF signal 112 is in-phase with the input RF signal 102. The in-phase RF signal 112 has the same phase as the input RF signal 102 (zero degrees shift). In the illustrated example, the second RF signal 114 is in quadrature (shifted 90 degrees) compared to the in-phase RF signal 112.

An in-phase power divider 120 is adapted to divides a local oscillator signal 104 into a first local oscillator signal 122 (LO1) and a second local oscillator signal 124 (LO2), both in-phase with the local oscillator signal 104. The local oscillator signal 104 can be, for example, 9 GHz signal.

The in-phase RF signal 112 and the first local oscillator signal 122 are mixed in a first mixer 130 resulting in signals in a number of frequencies including a first IF signal (IF1) 132 at the IF frequency. The phase-shifted RF signal 114 and the second local oscillator signal 124 are mixed in a second mixer 160 resulting in signals in a number of frequencies including a second IF signal 162 at the IF frequency. In the illustrated conventional image reject down-conversion mixer 100, the IF signal can be, for example, 1 GHz but this can vary depending on application.

The first IF signal 132 and the second IF signal 162 are introduced to a second quadrature hybrid coupler 190. The second quadrature hybrid coupler 190 combines the first IF signal 132 and the second IF signal 162 to produce, at its first output port 192, an IF upper side band (USB) signal 192 and at its second output port 194, an IF lower side band (LSB) signal 194. For convenience, the port (for example, the first output port 192) and the signal (for example, the USB signal 192) at the port are assigned the same reference numeral.

Figure 2A:
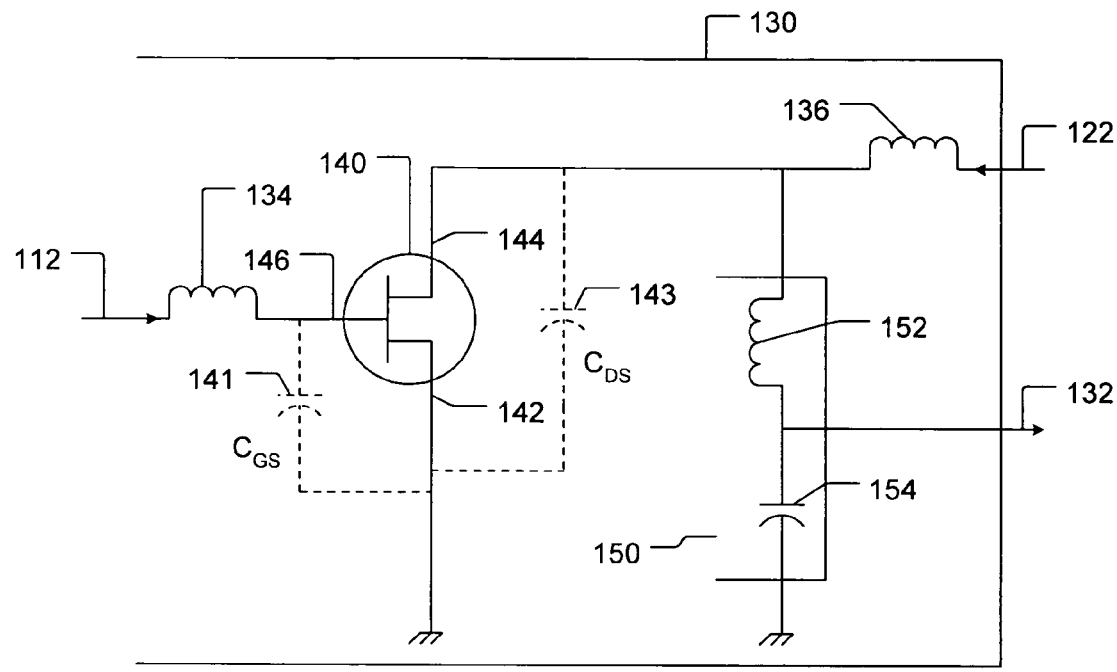
FIGS. 2A and 2B are a schematic diagrams of components of the image rejection mixer of FIG. 1.
Figure 2B:
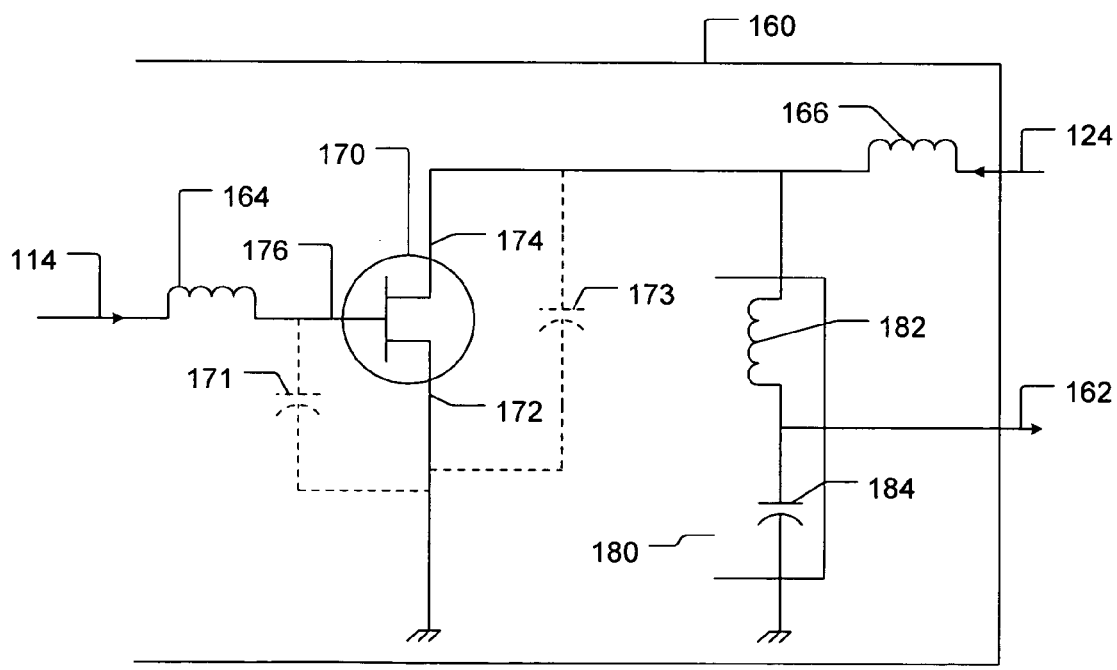

The conventional image reject down-conversion mixer 100 often utilizes, for its first and second mixers 130 and 160, single-ended FET mixer structure shown in FIGS. 2A and 2B. FIGS. 2A and 2B are more detailed illustration of the two mixers 130 and 160 as single-ended FET mixers 130 and 160, and include schematic diagrams of the single-ended FET mixers 130 and 160.

Referring to FIGS. 1, 2A, and 2B, the first single-ended FET mixer 130 includes a switching device 140 having a first current terminal 142, a second current terminal 144, and a gate terminal 146. In the illustrated example, the switching device 140 is a field effect transistor (FET) 140 having a source terminal 142, a drain terminal 144, and a gate terminal 146.

In the illustrated first single-ended FET mixer 130 configuration, the first RF signal 112 is injected into the gate terminal 146 of the FET 140 and the first local oscillator signal 122 is injected into the drain terminal 144 of the FET 140. In this configuration, the first mixer 130 acts as a drain pumped mixer. In an alternate configuration, the input signals (the first RF signal 112 and the first local oscillator signal 122) of the first mixer 130 can be switched such that the first RF signal 112 is injected into the drain terminal 144 of the FET 140 and the first local oscillator signal 122 is injected into the gate terminal 146 of the FET 140. In the alternate configuration, the first mixer 130 acts as a resistive mixer. In either case, mixing of the input signals (the first RF signal 112 and the first local oscillator signal 122) is achieved, and the first IF signal 132 is extracted from the drain terminal 144 through an IF filter 150 including an IF filter inductor 152 and an IF filter capacitor 154.

The first mixer 130 and the second mixer 160 have identical configuration and operational properties. The second single-ended FET mixer 160 includes a switching device 170 having a first current terminal 172, a second current terminal 174, and a gate terminal 176. In the illustrated example, the switching device 170 is a field effect transistor (FET) 170 having a source terminal 172, a drain terminal 174, and a gate terminal 176.

In the illustrated second single-ended FET mixer 160 configuration, the second RF signal 114 is injected into the gate terminal 176 of the FET 170 and the second local oscillator signal 124 is injected into the drain terminal 174 of the FET 170. In this configuration, the second mixer 160 acts as a drain pumped mixer. In an alternate configuration, the input signals (the second RF signal 114 and the second local oscillator signal 124) of the second mixer 160 can be switched such that the second RF signal 114 is injected into the drain terminal 174 of the FET 170 and the second local oscillator signal 124 is injected into the gate terminal 176 of the FET 170. In the alternate configuration, the second mixer 160 acts as a resistive mixer. In either case, mixing of the input signals (the second RF signal 114 and the second local oscillator signal 124) is achieved, and the second IF signal 162 is extracted from the drain terminal 174 through an IF filter 180 including an IF filter inductor 182 and an IF filter capacitor 184.

A second hybrid coupler 190 combines the first IF signal 132 and the second IF signal 162 to produce at least one of two sidebands in intermediate frequency—the IF upper side band (USB) signal 192, the IF lower side band (LSB) signal 194, or both. Operations of the conventional image reject down-conversion mixer 100 including the operations of its components illustrated in FIG. 1 are known in the art. See, for example, Stephen A. Mass, Microwave Mixers (Second Edition), Norwood, Mass.: Artech House, 1993, pp. 280 et seq.

Figure 3:
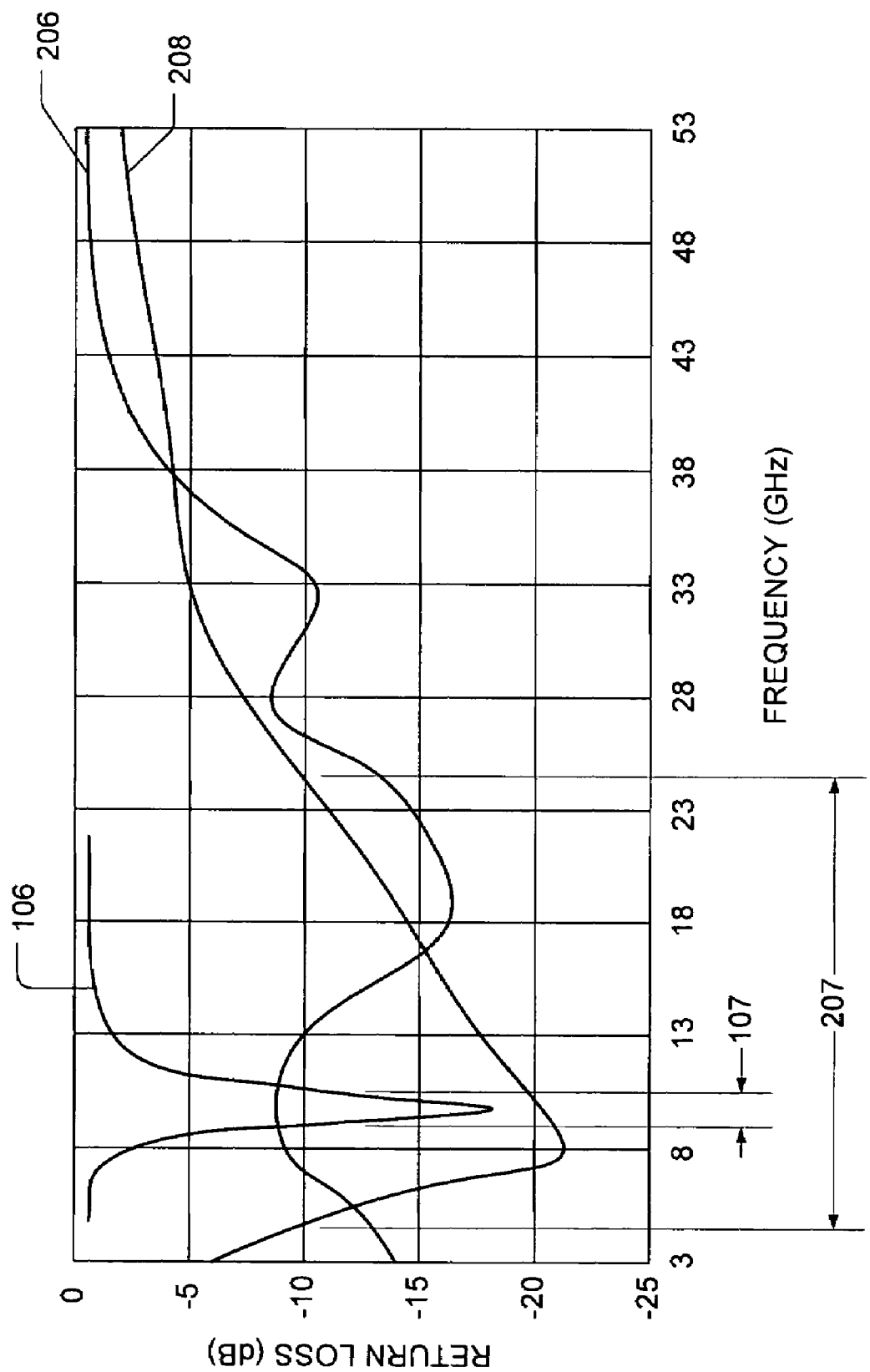
FIG. 3 is a graph illustrating input signal return loss efficiencies.

For the illustrated conventional image reject down-conversion mixer 100, operational frequency bandwidth is limited. FIG. 3 is a graph illustrating input signal return loss efficiency for a range of signal frequencies. Referring to FIGS. 1 and 3, the graph illustrates how much (in signal strength) of the RF or LO input signal is returned to the transmitting circuit as return signal.

Preferably, all of the input RF or LO signal is received by the conventional image reject down-conversion mixer 100 and no signal is returned to the transmitting circuit. Thus, it is desirable to have most negative value as the return loss measurement indicating that much of the input signal is received by the conventional image reject down-conversion mixer 100 and very little signal is returned to the transmitting circuit. At the same time, it is undesirable to have a high value as the return loss measurement. For example, a return loss of zero (0) means that the entire input signal is returned to the transmitting circuit and no signal is received or accepted by the conventional image reject down-conversion mixer 100. This is an undesirable result. In FIG. 3, return loss curve 106 represents the return loss property of the first RF input 112 port of the first single-ended mixer 130 and return loss property of the second RF input 114 port of the second single-ended mixer 160. Similarly, the return loss curve 106 represents the return loss property of the first LO input 122 port of the first single-ended mixer 130 and return loss property of the second LO input 124 port of the second single-ended mixer 160.

Figure 4:
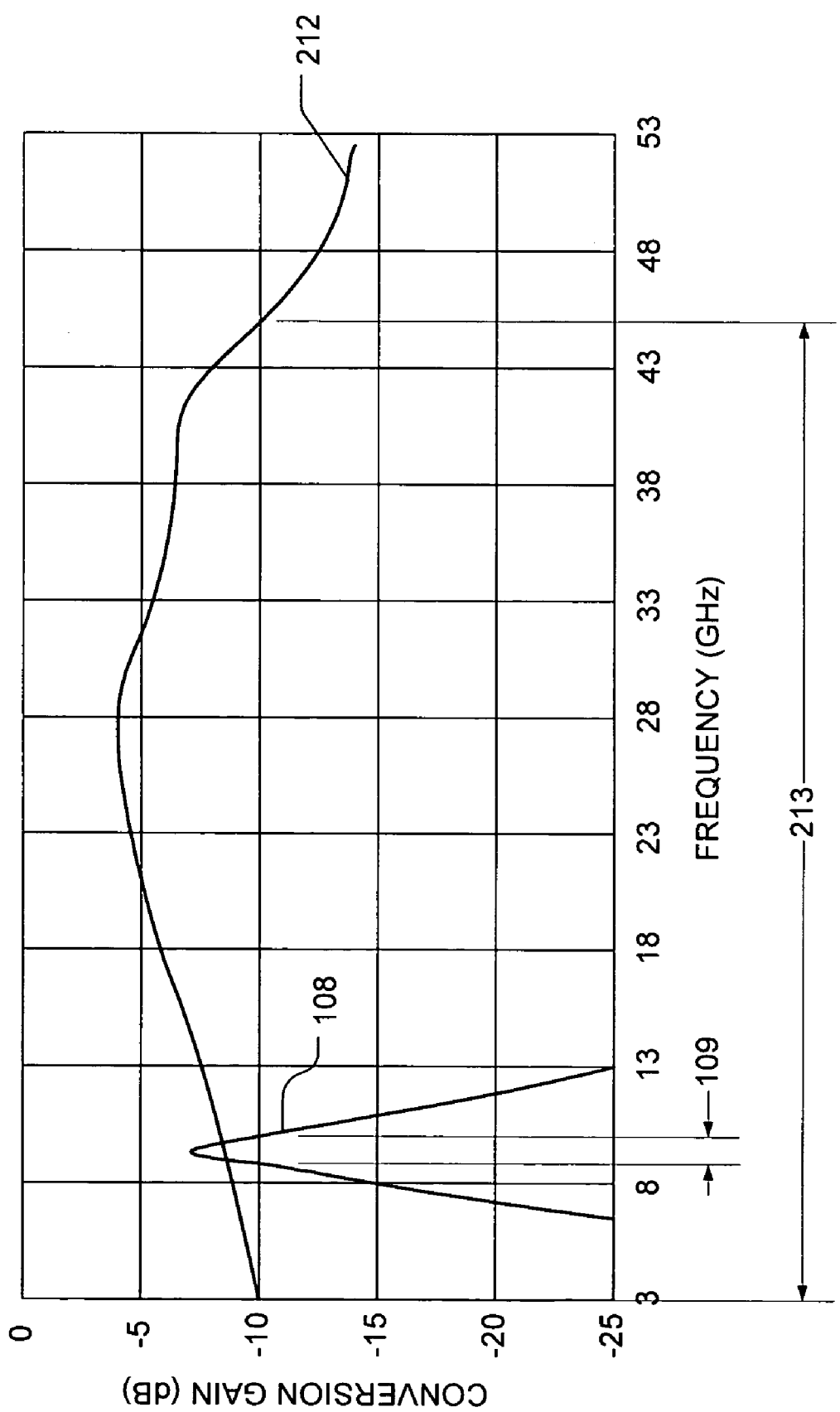
FIG. 4 is a graph illustrating conversion gain.

FIG. 4 is a graph illustrating conversion gain. Conversion gain is a ratio of the amplitude (signal strength, or power) of the output IF USB signal 192 or the output IF LSB signal 194 to the amplitude (signal strength, or power) of the input RF signal 102. Preferably, the conversion gain is zero (0) dB which means that all of the input power is converted to output power without a loss. Practically, there is some loss inherent in any conversion circuitry. Thus, it is desirable to have greatest possible conversion gain ratio (least negative value, closest to zero). At the same time, it is undesirable to have smaller values (most negative value), for smaller values indicate that smaller portion of the input power is converted to output power. In FIG. 4, conversion gain curve 108 represents the conversion efficiency of the conventional image reject down-conversion mixer 100.

Referring to FIGS. 1, 3, and 4, as indicated by the return loss curve 106, the single ended mixers 130 and 180 have high return loss outside a narrow range 107 of input RF frequencies around 10 GHz. That is, outside the a narrow range 107 of input RF frequencies, the conventional image reject down-conversion mixer 100 return much of the input signal to the transmitting circuit. Moreover, as indicated by the conversion gain curve 108, the conventional image reject down-conversion mixer 100 has low conversion gain efficiency outside a narrow range 109 of input RF frequencies around 10 GHz. That is, outside the narrow range 109 of input RF frequencies, the conventional image reject down-conversion is very inefficient. The return loss curve 106 and the conversion gain curve 108 are related in that the conversion gain depends on how much power enters the mixer and how much power is lost to return loss.

In short, the bandwidth of the conventional image rejection down-conversion mixer 100 is limited to a narrow range of operating frequencies.

For some applications such as for instrumentation or electronic warfare (EW) applications, it is desirable for a mixer (down-conversion image reject mixer or up-conversion mixer) to have high efficiency of operation for a wide range of input frequencies, or have wide bandwidth.

The conventional image reject down-conversion mixer 100 with its narrow operational bandwidth is not suitable for these applications. The operational bandwidth of the conventional image reject down-conversion mixer 100 of FIGS. 1, 2A, and 2B is limited because of various factors including input impedance of the single-ended mixers 130 and 160 of the conventional image reject down-conversion mixer 100.

The reason for this is that its single-ended mixers 130 and 160 present changing input impedance value and output impedance values change as the input and output signal frequencies are shifted away from the designed center frequency. Consequently, the conversion loss of the conventional image rejection down-conversion mixer 100 is confined to a narrow frequency range where the input impedance and the output impedance of the single-ended mixers 130 and 160 are nominally at 50 ohms thus matching the input impedance and the output impedance of surrounding circuits.

The first single-ended mixer 130 has a gate matching circuit including an inductor 134 connected to the gate terminal 146 of the FET 140. The inductance of the inductor 134 and a parasitic capacitance $C_{GS}$ 141 that exists between the source terminal 142 and the gate terminal 146 of the FET 140 combine to determine the input impedance of the first mixer 130 to the first RF signal 112.

The first single-ended mixer 130 has a drain matching circuit including another inductor 136 connected to the drain terminal 144 of the FET 140. The inductance of the inductor 136 and a parasitic capacitance $C_{DS}$ 143 that exists between the source terminal 142 and the drain terminal 144 of the FET 140 combine to determine the input impedance of the first mixer 130 to the first LO signal 122.

The second single-ended mixer 160 has a gate matching circuit including an inductor 164 connected to the gate terminal 176 of the FET 170. The inductance of the inductor 164 and a parasitic capacitance $C_{GS}$ 171 that exists between the source terminal 172 and the gate terminal 176 of the FET 170 combine to determine the input impedance of the second mixer 160 to the second RF signal 114.

The second single-ended mixer 160 has a drain matching circuit including another inductor 166 connected to the drain terminal 174 of the FET 170. The inductance of the inductor 166 and a parasitic capacitance $C_{DS}$ 173 that exists between the source terminal 172 and the drain terminal 174 of the FET 170 combine to determine the input impedance of the second mixer 130 to the second LO signal 124.

For both the first single-ended mixer 130 and the second single-ended mixer 160, both the gate and the drain input impedance circuits are serially connected inductor-capacitor (LC) circuits that have impedance characteristic of $$Z \cong R_s + R_g + \frac{1}{j\omega C_P}$$

where, $R_s$ is source resistance;
$R_g$ is gate resistance; and
$C_P$ is parasitic capacitance of either $C_{DS}$ value to calculate the drain input impedance or $C_{GS}$ value to calculate the gate input impedance.

As frequency shifts away from the resonant frequency of the LC circuit, the impedance becomes very high for both input and output signals. The high input and output impedance of the single-ended mixers 130 and 160 causes a mismatch of input and output impedance (both nominally at 50 ohms) of circuits surrounding the single-ended mixers 130 and 160. The impedance mismatch at frequencies outside the narrow operating bandwidth limits the operation of the conventional IRM 100 to the narrow bandwidth 107 and 109.

In summary, the conventional image rejection down-conversion mixer 100 suffers from narrow operating bandwidth.

III. Image Rejection Down-Conversion Mixer of the Present Invention

Figure 5:
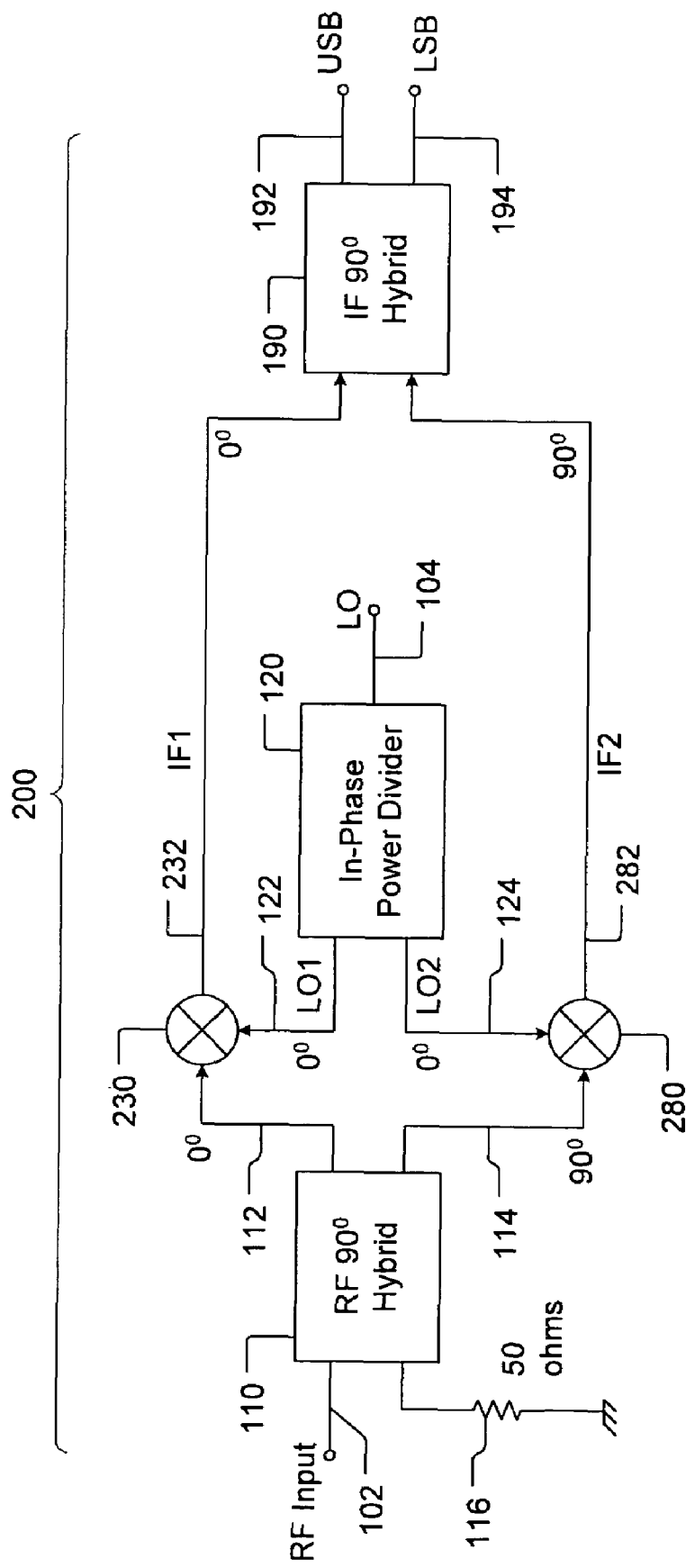
FIG. 5 is a block diagram of an image rejection mixer according to one embodiment of the present invention.

The narrow operating bandwidth stemming from the input impedance problem discussed above is overcome in the present invention by using traveling-wave mixers rather than single-ended mixers. FIG. 5 illustrates an image reject down-conversion mixer 200 (IRM 200) according to one embodiment of the present invention. Portions of the image reject down-conversion mixer 200 are similar to corresponding portions of the conventional image reject down-conversion mixer 100 of FIG. 1. Portions of the image reject down-conversion mixer 200 that are similar to corresponding portions of the conventional image reject down-conversion mixer 100 of FIG. 1 are assigned the same reference numerals.

Referring to FIG. 5, an input RF signal 102 is introduced to a first hybrid coupler 110. The input RF signal 102 can be, for example, a 10 GHz signal and may range from hundreds of MHz to many tens of GHz. For the present invention, radio frequency (RF) may range from hundreds of MHz to many tens of GHz. The first hybrid coupler 110 is a passive RF quadrature device that divides the input RF signal 102 to a first RF signal 112 and a second RF signal 114, the second RF signal 114 being in quadrature compared to the first RF signal 112. The first hybrid coupler 110 is terminated to ground by a 50 ohm terminating resistor 116. In the illustrated example, the first RF signal 112 is in-phase with the input RF signal 102. The in-phase RF signal 112 has the same phase as the input RF signal 102 (zero degrees shift). In the illustrated example, the second RF signal 114 is in quadrature (shifted 90 degrees) compared to the in-phase RF signal 112.

An in-phase power divider 120 is adapted to divides a local oscillator signal 104 into a first local oscillator signal 122 (LO1) and a second local oscillator signal 124 (LO2), both in-phase with the local oscillator signal 104. The local oscillator signal 104 can be, for example, 9 GHz signal.

The in-phase RF signal 112 and the first local oscillator signal 122 are mixed in a first mixer 230 resulting in signals in a number of frequencies including a first IF signal (IF1) 232 at the IF frequency. The phase-shifted RF signal 114 and the second local oscillator signal 124 are mixed in a second mixer 280 resulting in signals in a number of frequencies including a second IF signal 282 at the IF frequency. In the illustrated image reject down-conversion mixer 200, the IF signal can be, for example, 1 GHz but this can vary depending on application.

The first IF signal 232 and the second IF signal 282 are introduced to a second quadrature hybrid coupler 190. The IF quadrature hybrid coupler 190 combines the first IF signal 232 and the second IF signal 282 to produce, at its first output port 192, an IF upper side band (USB) signal 192 and at its second output port 194, an IF lower side band (LSB) signal 194. For convenience, the port (for example, the first output port 192) and the signal (for example, the USB signal 192) at the port are assigned the same reference numeral.

Figure 6A:
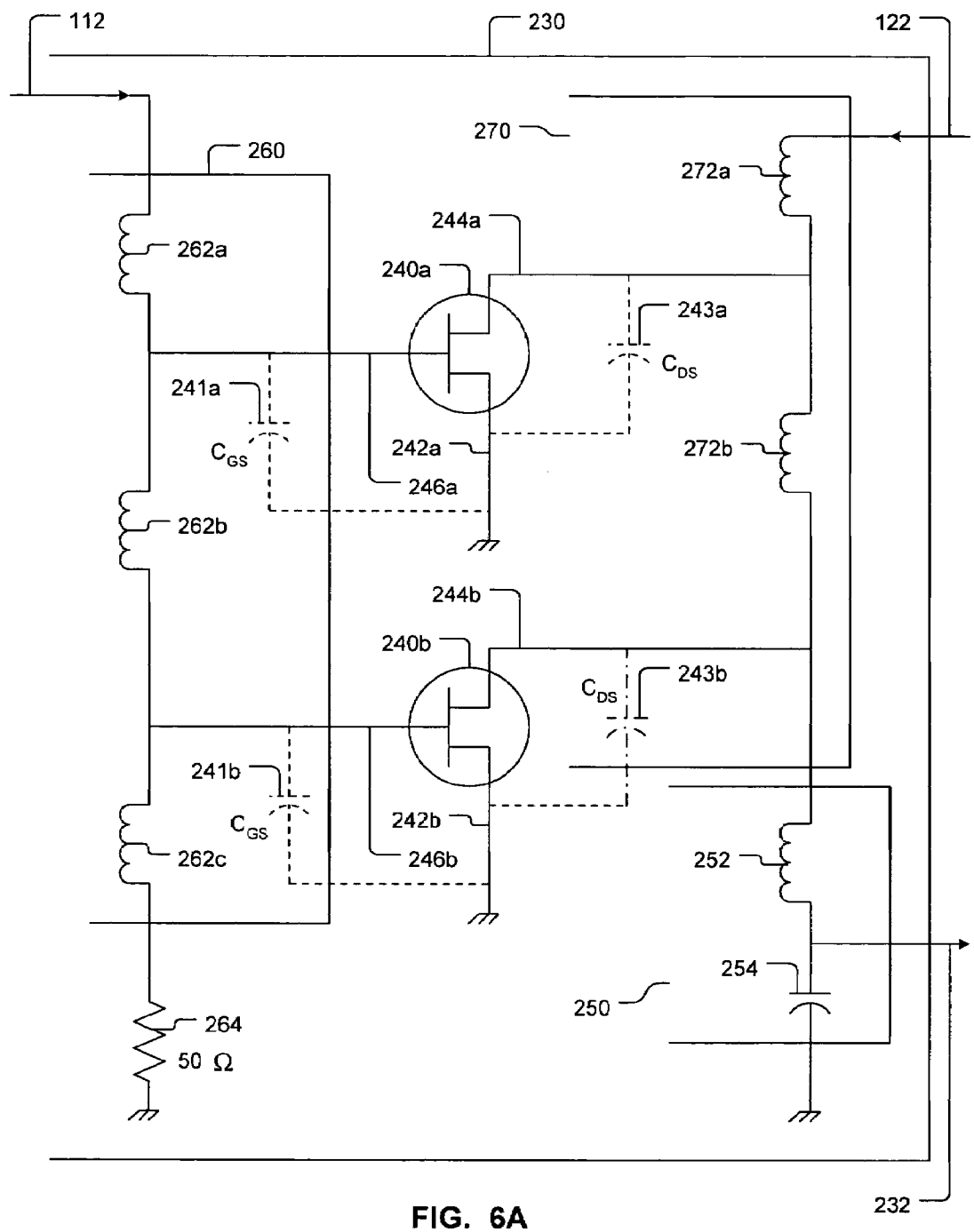
FIGS. 6A and 6B are schematic diagrams of components of the image rejection mixer of FIG. 5.
Figure 6B:
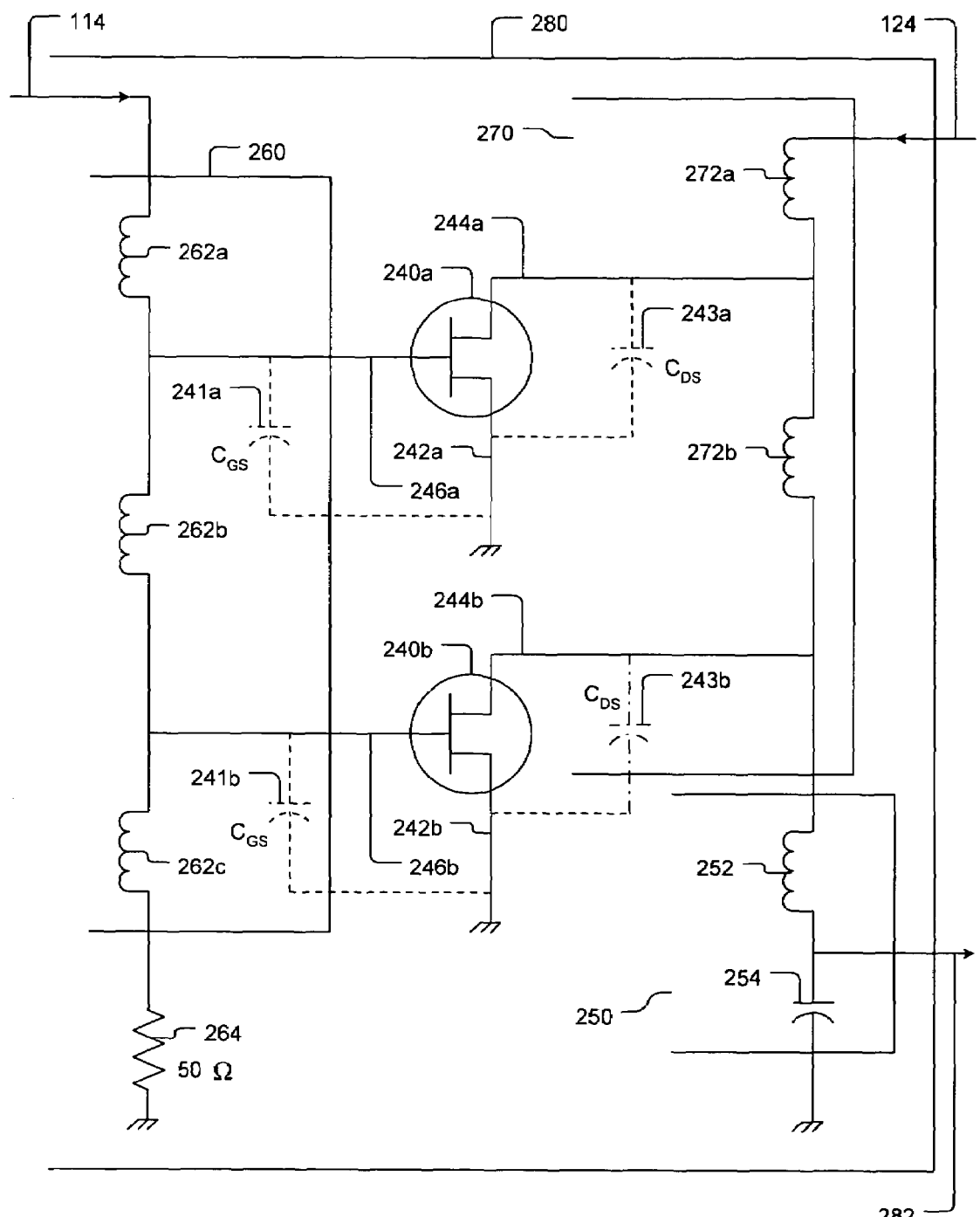

In the present invention, the first and second mixers 230 and 280 are traveling-wave mixers. FIGS. 6A and 6B are more detailed illustration of the two traveling-wave mixers 230 and 280 including schematic diagrams of the traveling-wave mixers 230 and 280.

Referring to FIGS. 5, 6A, and 6B, the first traveling-wave mixer 230 includes a first switching device 240a having a first current terminal 242a, a second current terminal 244a, and a gate terminal 246a. In the illustrated example, the first switching device 240a is a field effect transistor (FET) 240a having a source terminal 242a, a drain terminal 244a, and a gate terminal 246a. The first traveling-wave FET mixer 230 includes a second switching device 240b having a first current terminal 242b, a second current terminal 244b, and a gate terminal 246b. In the illustrated example, the second switching device 240b is a field effect transistor (FET) 240b having a source terminal 242b, a drain terminal 244b, and a gate terminal 246b.

The first traveling-wave FET mixer 230 has a gate impedance matching circuit 260 including a series of input inductors 262a, 262b, and 262c connected to the gate terminals 246a and 246b of the FETS 240a and 240b. In one embodiment, the input inductors 262a, 262b, and 262c have values range in the order of tenths of nano Henries, for example, 0.4 nano Henries, 0.6 nano Henries, and 0.6 nano Henries, respectively.

The construction and properties of the FETS 240a and 240b may vary depending on implementation. In one embodiment, the FET 240a or 260 is a depletion FET with gate width Wg of approximately 100 microns and Gate length Lg of approximately 0.15.

As illustrated, the first RF signal 112 is injected into the gate terminals 246a and 246b via the gate input impedance matching circuit 260. The gate input impedance matching circuit 260 is terminated to ground by a 50 ohm terminating resistor 426. Terminating transistors in the Figures have 50 ohm resistance and can be, for example, Tantalum nitride thin film resistor.

The first traveling-wave FET mixer 230 has a drain input impedance matching circuit 270 including a series of input inductors 272a and 272b connected to the drain terminals 244a and 244b of the FETS 240a and 240b. As illustrated, the first LO signal 122 is injected into the drain terminals 244a and 244b via the drain input impedance matching circuit 270. In one embodiment, the input inductors 222a and 272b have values range in the order of tenths of nano Henries, for example, 0.6 nano Henries.

The input signals (the first RF signal 112 and the first local oscillator signal 122) are mixed by the FETS 240a and 240b, and the first IF signal 232 is extracted from the drain terminals 244a and 244b.

The first traveling-wave FET mixer 230 has a drain input low pass filter 250 adapted to prevent leakage of the output RF signal 232. The low pass filter 250 includes filter inductor 252 serially connected to a filter capacitor 254. In one embodiment, the inductor 252 has value 0.6 nano Henry and the filter capacitor 254 has value of 0.35 pico Farad.

Continuing the refer to FIGS. 5, 6A, and 6B, the first traveling-wave mixer 230 and the second traveling-wave mixer 280 have identical configuration and operational properties, but the input and output signals are different between the first mixer 230 and the second mixer 280. Portions of the second mixer 280 that are similar to corresponding portions of the first mixer 230 are assigned the same reference numbers.

The input signals (the second RF signal 114 and the second local oscillator signal 124) are mixed by the FETS 290a and 290b, and the second IF signal 282 is extracted from the drain terminals 294a and 294b.

For the first traveling-wave filter 230, its input impedance to the first input RF signal 112 is defined by the gate input impedance matching circuit 260. In the gate input impedance matching circuit 260, inductance of the serially connected inductors 262a, 262b, and 262c combine with parasitic source-gate capacitance 241a and 242b to define an input impedance of approximately 50 ohms. The gate input impedance matching circuit 260 behaves similar to a transmission line presenting a relatively constant 50 ohms of impedance to a wide range of frequencies of the first input RF signal 112.

Thus, within the image reject down-conversion mixer 200, impedance between various components of the image reject down-conversion mixer 200 matches for the wide range of input and output signal frequencies, allowing the image reject down-conversion mixer 200 to efficiently operate for the wide range of input and output frequencies.

In the illustrated embodiment, the parasitic source-gate capacitance 241a and 242b have values in the order of tenths of pico Farads, for example, 0.11 pico Farad.

Likewise, in the drain input impedance matching circuit 270, inductance of the serially connected inductors 272a and 272b combine with parasitic drain-source capacitance 243a and 243b to define an input impedance of approximately 50 ohms. The drain input impedance matching circuit 270 behaves similar to a transmission line presenting a relatively constant 50 ohms of impedance to a wide range of frequencies of the first LO signal 122. In the illustrated embodiment, the parasitic drain-source capacitance 243a and 243b have values in the order of tenths of pico Farads, for example, 0.11 pico Farad.

Referring again to FIGS. 3 and 4 as well as to FIGS. 5, 6A, and 6B, return loss curve 206 represents the return loss property of the RF input 112 line of the traveling-save mixer 230 and the return loss property of the RF input 114 line of the traveling-save mixer 280. The return loss curve 208 represents return loss property of LO input 122 of the traveling-save mixer 230 and return loss property of LO input 124 of the traveling-save mixer 280. As illustrated by the RF return loss curve 206, the traveling-wave mixers 230 and 260 have low return loss (less then −10 dB) for a wide range 207 of input RF frequencies.

Conversion gain curve 212 represents the conversion gain efficiency of image reject down-conversion mixer 200. As illustrated by the conversion gain curve 212, the image reject down-conversion mixer 200 has relatively high (−10 dB or better) for a wide range 213 of input RF frequencies.

Thus, within the image reject down-conversion mixer 200, impedance between various components of the image reject down-conversion mixer 200 matches for the wide range of input and output signal frequencies, allowing the image reject down-conversion mixer 200 to efficiently operate for the wide range of input and output frequencies.

The image reject down-conversion mixer 200 is often fabricated as a monolithic microwave integrated circuit (MMIC).

IV. Conventional Up-Conversion Mixer

Figure 7:
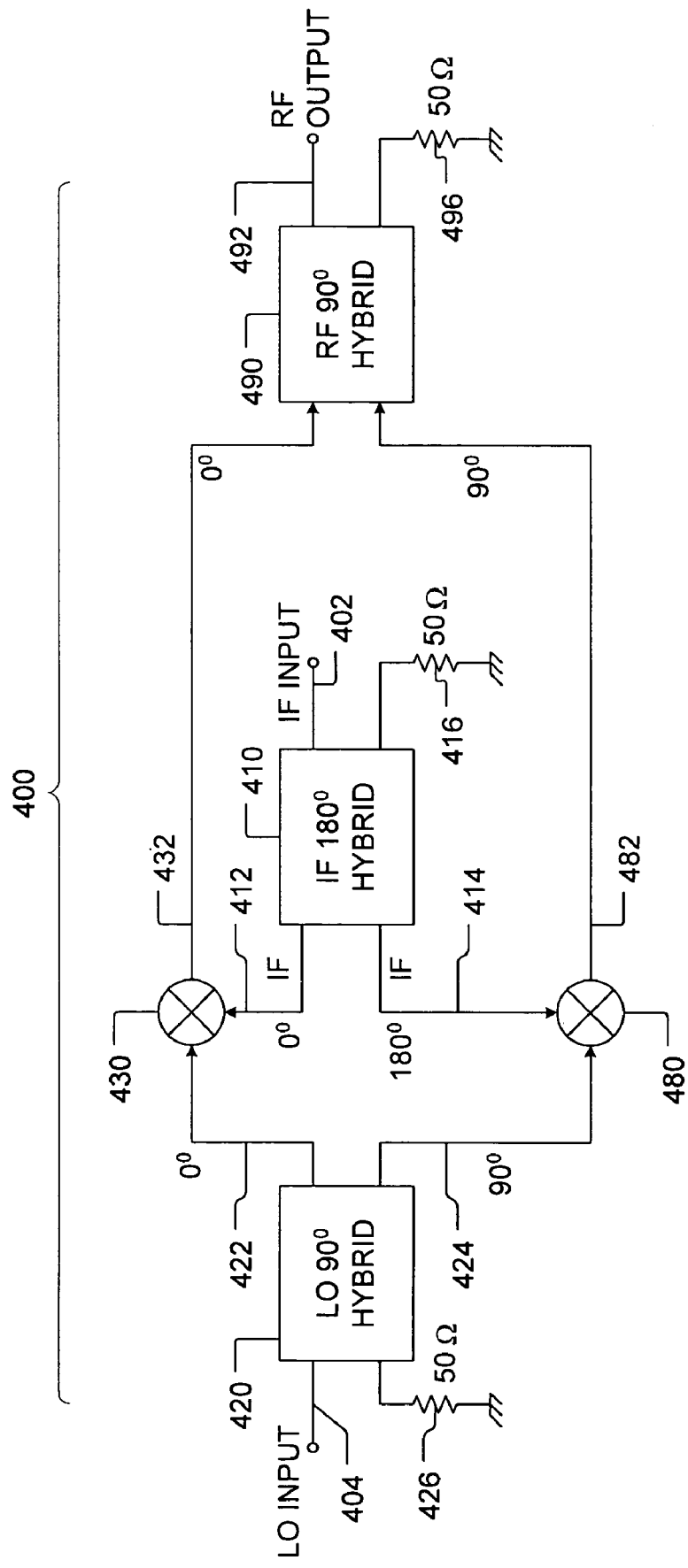
FIG. 7 is a block diagram of an up-conversion mixer according to one embodiment of the present invention.

The narrow operational bandwidth limitation of the conventional image reject down-conversion mixer 100 of FIG. 1 is also present in a conventional up-conversion mixer 400 of FIG. 7.

FIG. 7 is a block diagram of a conventional up-conversion mixer (UPM) 400. Referring to FIG. 7, an input intermediate frequency IF signal 402 is introduced to a first hybrid coupler 410. The input IF signal 402 can be, for example, a 1 GHz signal and may range from hundreds of MHz to many GHz.

The first hybrid coupler divides the input IF signal 402 to a first IF signal 412 and a second IF signal 414, the second IF signal 414 being 180 degree off phase compared to the first IF signal 412. The first hybrid coupler 410 is terminated to ground by a 50 ohm terminating resistor 416.

In the illustrated example, the first IF signal 412 is in-phase with the input IF signal 402. The in-phase IF signal 412 has the same phase as the input IF signal 402 (zero degrees shift). In the illustrated example, the second IF signal 413 is in quadrature (shifted 90 degrees) compared to the in-phase RF signal 112.

A local oscillator (LO) hybrid coupler 420 is adapted to divides a local oscillator signal 404 into a first local oscillator signal 422 (LO1) and a second local oscillator signal 424 (LO2), with the second local oscillator signal 424 being in quadrature compared to the first local oscillator signal 422. The local oscillator signal 404 can be, for example, 9 GHz signal. The local oscillator (LO) hybrid coupler 420 is terminated to ground by a 50 ohm terminating resistor 426.

The first IF signal 412 and the first local oscillator signal 422 are mixed in a first mixer 430 resulting in signals in a number of frequencies including a first RF signal 432 at an RF frequency such as, for example, 10 GHz. The second IF signal 414 and the second local oscillator signal 424 are mixed in a second mixer 480 resulting in signals in a number of frequencies including a second RF signal 462 at the RF frequency. In the illustrated conventional up-conversion mixer 400, the RF signal can be, for example, 10 GHz but this can vary depending on application.

The first RF signal 432 and the second RF signal 462 are introduced to a second hybrid coupler 490. The second hybrid coupler 490 combines the first RF signal 432 and the second RF signal 462 to produce an RF output signal 492. For convenience, the port (for example, the RF output port 492) and the signal (for example, the RF output signal) at the port are assigned the same reference numeral.

Figure 8A:
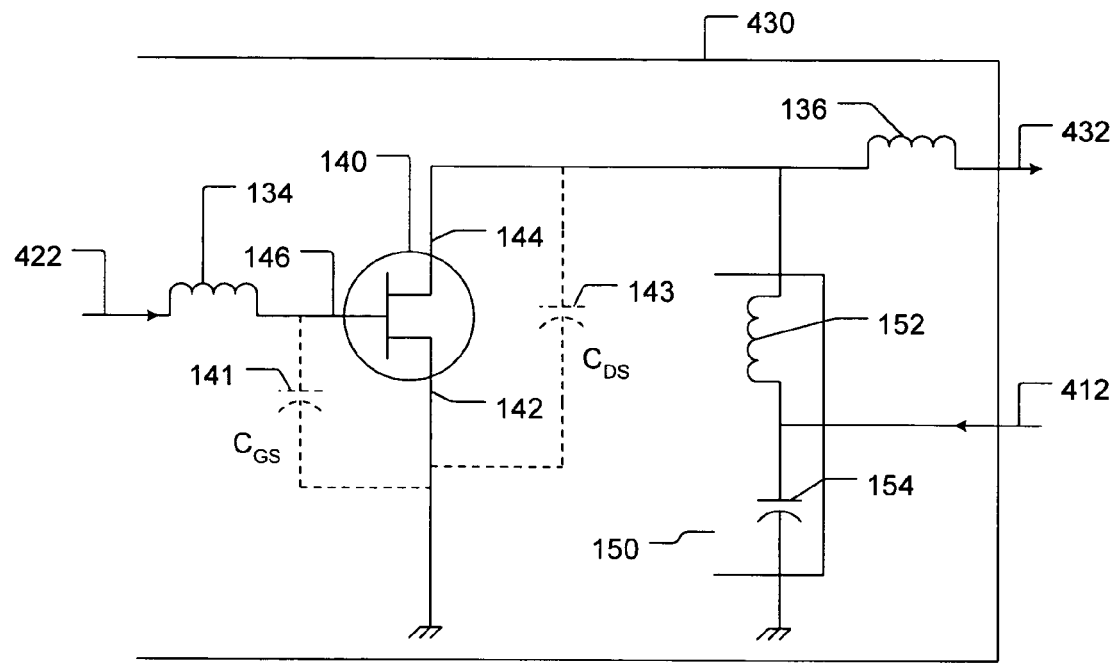
FIGS. 8A and 8B are schematic diagrams of components of the up-conversion mixer of FIG. 7.
Figure 8B:
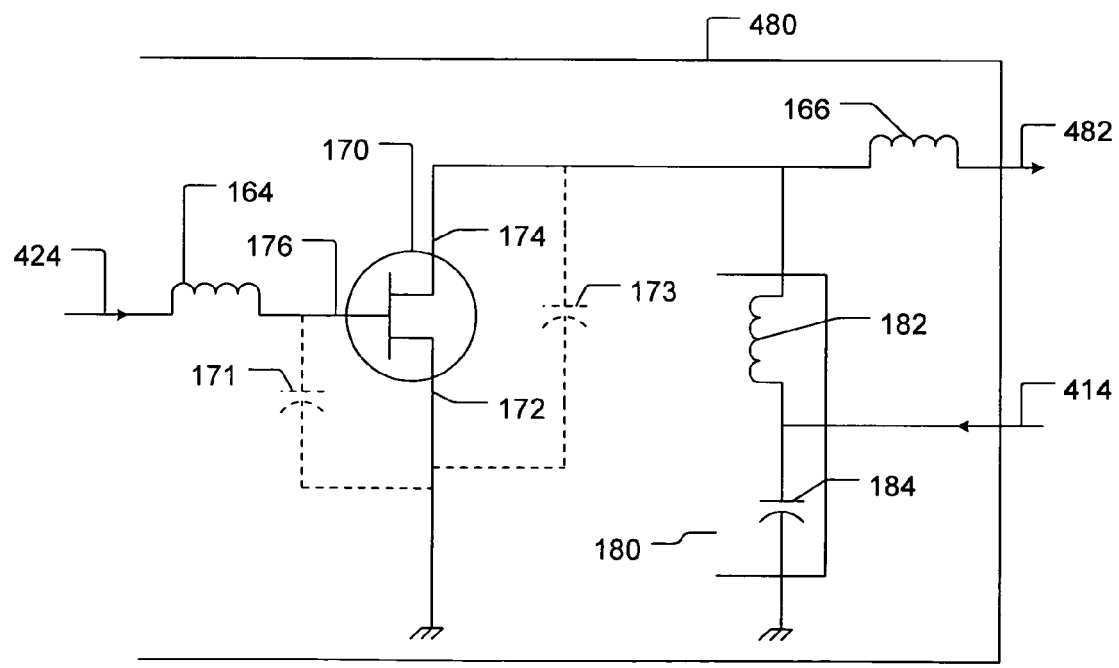

Similar to the conventional image reject down-conversion mixer 100 of FIG. 1, the conventional up-conversion mixer 400 utilizes, for its first and second mixers 430 and 480, single-ended FET mixer structure shown in FIGS. 8A and 8B.

FIGS. 7A and 7B are more detailed illustration of the two mixers 430 and 480 as single-ended FET mixers 430 and 480, and include schematic diagrams of the single-ended FET mixers 430 and 480.

Referring to FIGS. 7, 8A, and 8B, the first singled-ended FET mixer 430 receive, as input, the first IF signal 412 and the first local oscillator signal 422, and mixes these input signals to produce the first RF signal 432. The second singled-ended FET mixer 480 receive, as input, the second IF signal 414 and the second local oscillator signal 424, and mixes these input signals to produce the second RF signal 434.

Except for this operational, difference, the single-ended FET mixers 430 and 480 are similarly configured to the singled-ended mixers 130 and 160 of FIGS. 2A and 2B, respectively. For this reason, portions of the single-ended FET mixers 430 and 480 are assigned the same reference numerals as the corresponding portions of the single-ended FET mixers 130 and 160.

In the illustrated first single-ended FET mixer 430 configuration, the first IF signal 412 is injected into the drain terminal 144 of the FET 140 and the first local oscillator signal 422 is injected into the gate terminal 146 of the FET 140. These input signals (the first IF signal 412 and the first local oscillator signal 422) are mixed, resulting in the first RF signal 432 extracted from the drain terminal 144.

The first mixer 430 and the second mixer 480 have identical configuration and operational properties but different input and output signals. For the second single-ended FET mixer 480, the second IF signal 414 is injected into the drain terminal 174 of the FET 170 and the second local oscillator signal 424 is injected into the gate terminal 176 of the FET 170. These input signals (the second IF signal 414 and the second local oscillator signal 424) are mixed, resulting in the second RF signal 462 extracted from the drain terminal 174.

The second hybrid coupler 490 combines the first RF signal 432 and the second RF signal 462 to produce an RF output signal 492. The second hybrid coupler 490 is terminated to ground by a 50 ohm terminating resistor 496.

The conventional up-conversion mixer 400 suffers from the same narrow bandwidth problems suffered by the image rejection down-conversion mixer discussed above. That is, the single-ended mixers 430 and 480 present high input impedance and high output impedance to signals having frequencies outside a narrow range of operating frequencies. This creates mismatching of input and output impedances with the rest of the components of the conventional up-conversion mixer 400. The impedance mismatch at frequencies outside the narrow operating bandwidth limits the operation of the conventional up-conversion mixer 400 to the narrow bandwidth 107 and 109 of FIGS. 3 and 4.

In summary, the conventional up-conversion mixer 400 suffers from narrow operating bandwidth.

V. Up-Conversion Mixer of the Present Invention

Figure 9:
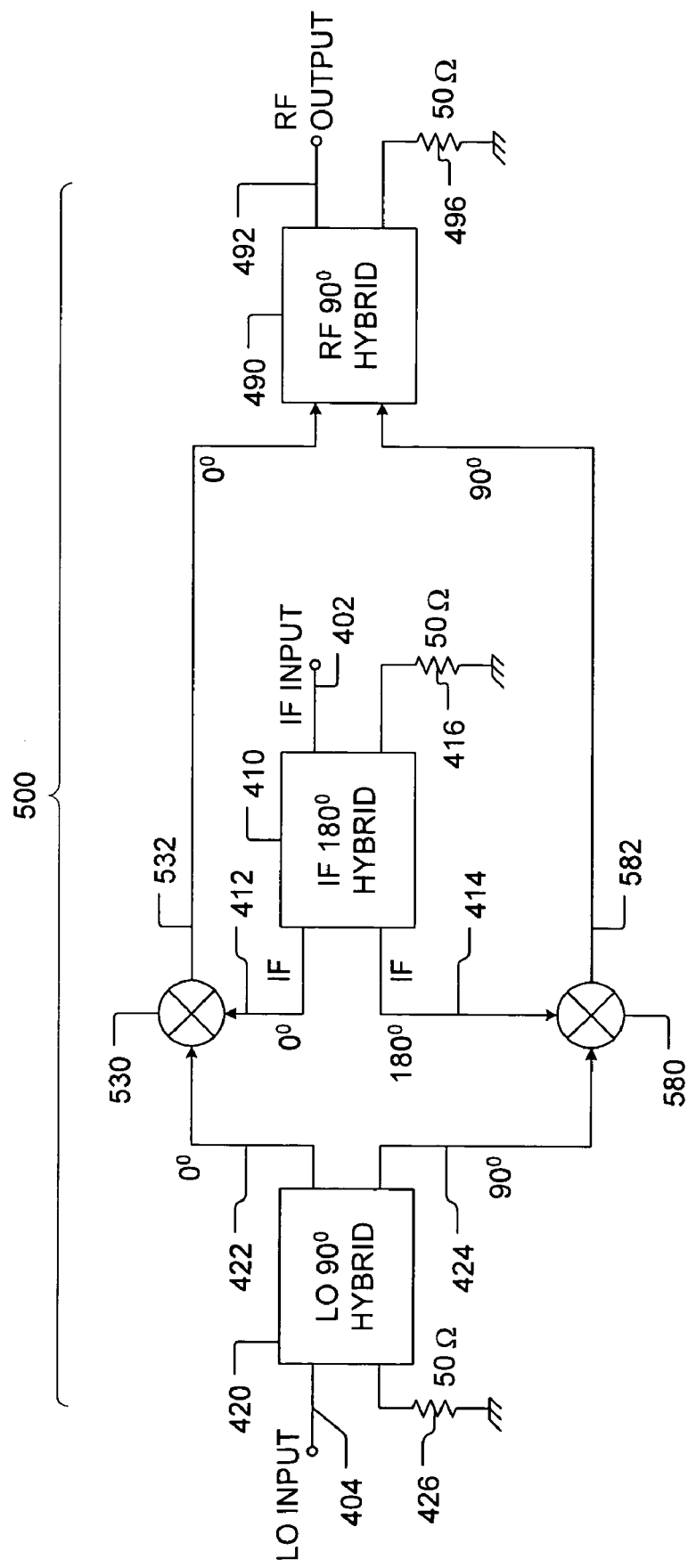
FIG. 9 is a block diagram of an up-conversion mixer according to one embodiment of the present invention.

The narrow operating bandwidth stemming from the input impedance problem discussed above is overcome in the present invention by using traveling-wave mixers rather than single-ended mixers. FIG. 9 illustrates an up-conversion mixer 500 (UPM 500) according to one embodiment of the present invention. Portions of the up-conversion mixer 500 are similar to corresponding portions of the conventional up-conversion mixer 400 of FIG. 7. Portions of the up-conversion mixer 500 that are similar to corresponding portions of the conventional up-conversion mixer 400 of FIG. 7 are assigned the same reference numerals.

Referring to FIG. 9, an input IF signal 102 is introduced to a first hybrid coupler 410. The input IF signal 402 can be, for example, a 1 GHz signal and may range from hundreds of MHz to many GHz. The first hybrid coupler 410 divides the input IF signal 402 to a first IF signal 412 and a second IF signal 414, the second IF signal 114 being 180 degree off phase compared to the first IF signal 412. The first hybrid coupler 410 is terminated to ground by a 50 ohm terminating resistor 416.

In the illustrated example, the first IF signal 412 is in-phase with the input IF signal 402. The in-phase IF signal 412 has the same phase as the input IF signal 402 (zero degrees shift). In the illustrated example, the second IF signal 413 is in quadrature (shifted 90 degrees) compared to the in-phase RF signal 112.

A local oscillator (LO) hybrid coupler 420 is adapted to divides a local oscillator signal 404 into a first local oscillator signal 422 (LO1) and a second local oscillator signal 424 (LO2), with the second local oscillator signal 424 being in quadrature compared to the first local oscillator signal 422. The local oscillator signal 404 can be, for example, 9 GHz signal. The local oscillator (LO) hybrid coupler 420 is terminated to ground by a 50 ohm terminating resistor 426.

The first IF signal 412 and the first local oscillator signal 422 are mixed in a first mixer 530 resulting in signals in a number of frequencies including a first RF signal 532 at an RF frequency such as, for example, 10 GHz. The second IF signal 414 and the second local oscillator signal 424 are mixed in a second mixer 580 resulting in signals in a number of frequencies including a second RF signal 582 at the RF frequency. In the illustrated conventional up-conversion mixer 400, the RF signal can be, for example, 10 GHz but this can vary depending on application. For the present invention, radio frequency (RF) may range from hundreds of MHz to many tens of GHz.

The first RF signal 532 and the second RF signal 582 are introduced to a second hybrid coupler 490. The second hybrid coupler 490 combines the first RF signal 432 and the second RF signal 462 to produce an RF output signal 492. For convenience, the port (for example, the RF output port 492) and the signal (for example, the RF output signal) at the port are assigned the same reference numeral.

Figure 10A:
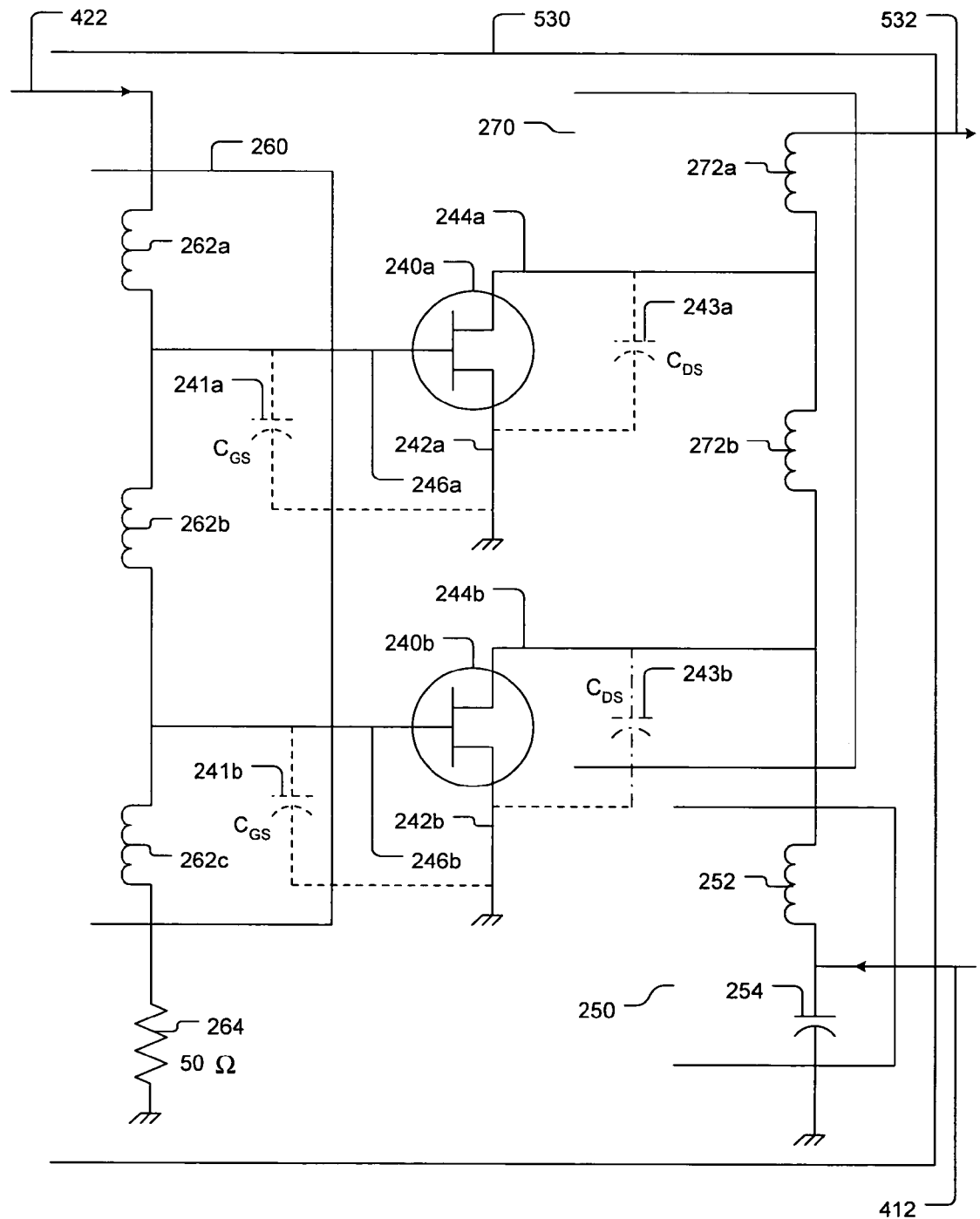
FIGS. 10A and 10B are schematic diagrams of components of the up-conversion mixer of FIG. 9.
Figure 10B:
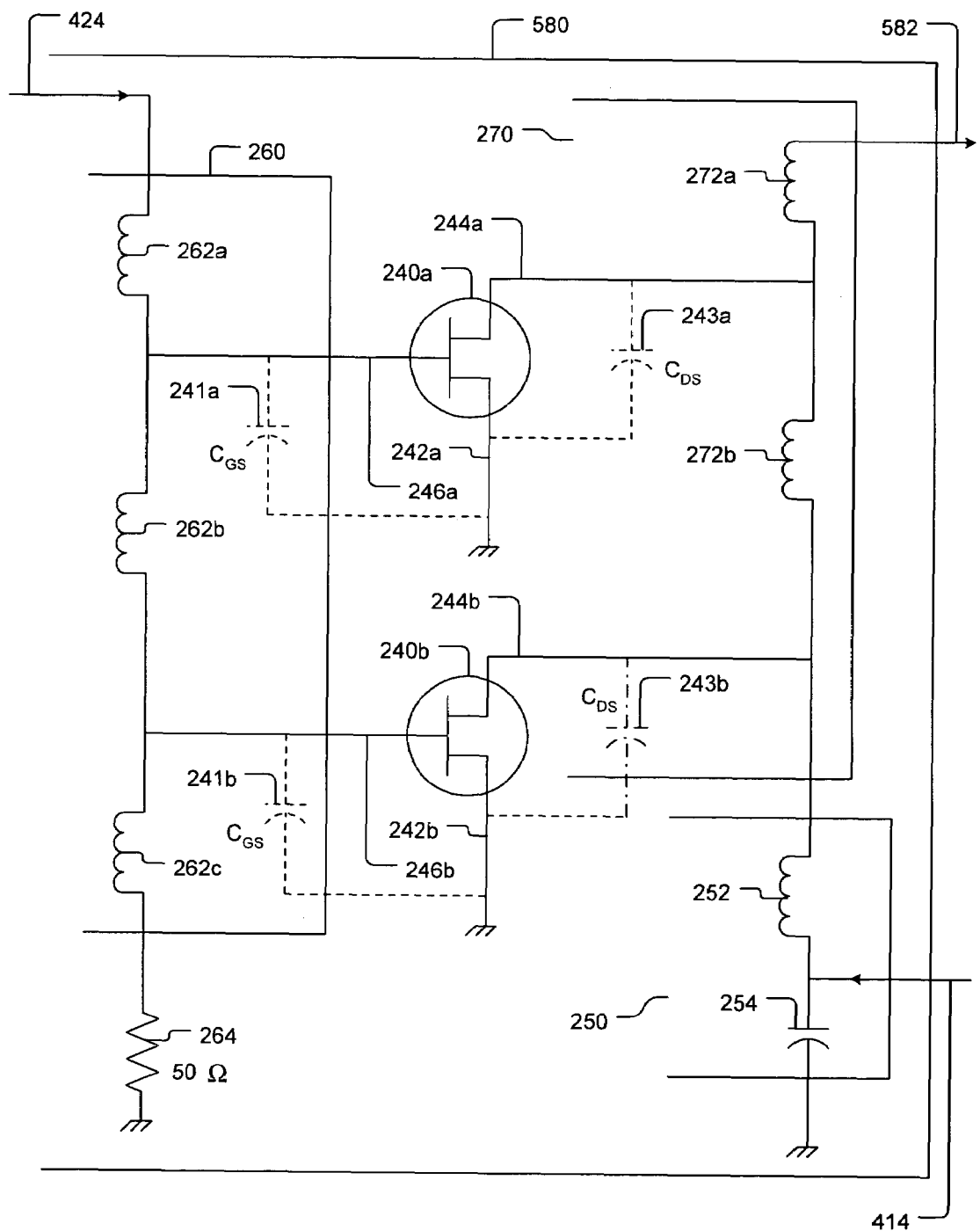

In the present invention, the first and second mixers 530 and 580 are traveling-wave mixers. FIGS. 10A and 10B are more detailed illustration of the two traveling-wave mixers 530 and 580 including schematic diagrams of the traveling-wave mixers 530 and 580.

Referring to FIGS. 9, 10A, and 10B, portions of the first traveling-wave FET mixer 530 are similar to corresponding portions of the first traveling-wave FET mixer 230 of FIG. 6A. Portions of the first traveling-wave FET mixer 530 that are similar to corresponding portions of the first traveling-wave FET mixer 230 of FIG. 6A are assigned the same reference numerals. Also, portions of the second traveling-wave FET mixer 580 are similar to corresponding portions of the second traveling-wave FET mixer 280 of FIG. 6B. Portions of the second traveling-wave FET mixer 580 that are similar to corresponding portions of the second traveling-wave FET mixer 280 of FIG. 6B are assigned the same reference numerals.

Referring to FIGS. 9, 10A, and 10B, the first traveling-wave mixer 530 and the second first traveling-wave mixer 580 have identical configuration as the first traveling-wave mixer 230 and the second first traveling-wave mixer 280 of FIGS. 6A and 6B. For this reason, portions of the first traveling-wave mixer 530 and the second first traveling-wave mixer 580 that are similar to corresponding portions of the first traveling-wave mixer 230 and the second first traveling-wave mixer 280 of FIGS. 6A and 6B are assigned the same reference numerals.

However, here, the input and the output signals are different, and the operations are than the first traveling-wave mixer 230 and the second first traveling-wave mixer 280 of FIGS. 6A and 6B.

In the illustrated first single-ended FET mixer 530 configuration, the first local oscillator signal 422 is injected into the gate terminals 246a and 246b via the gate input impedance matching circuit 260. The gate input impedance matching circuit 260 is terminated by an impedance matching terminating resistor 264 of, approximately 50 ohms.

The first traveling-wave FET mixer 530 has a drain input impedance matching circuit 270 including a series of input inductors 272a and 272b connected to the drain terminals 244a and 244b of the FETS 240a and 240b. As illustrated, the first IF signal 422 is injected into the drain terminals 244a and 244b via the drain input impedance matching circuit 270.

The input signals (the first IF signal 412 and the first local oscillator signal 422) are mixed by the FETS 240a and 240b, and the first RF signal 532 is extracted from the drain terminals 244a and 244b.

The first traveling-wave FET mixer 530 has a drain input low pass filter 250 adapted to prevent leakage of the output RF signal 532. The low pass filter 250 includes filter inductor 252 serially connected to a filter capacitor 254.

Continuing the refer to FIGS. 9, 10A, and 10B, the first traveling-wave mixer 530 and the second traveling-wave mixer 580 have identical configuration and operational properties, but the input and output signals are different between the first traveling-wave mixer 530 and the second traveling-wave mixer 580. Portions of the second mixer 580 that are similar to corresponding portions of the first mixer 530 are assigned the same reference numbers.

The input signals (the second IF signal 414 and the second local oscillator signal 424) are mixed by the FETS 290a and 290b, and the second RF signal 582 is extracted from the drain terminals 294a and 294b.

Continuing the refer to FIGS. 9, 10A, and 10B, the first traveling-wave mixer 530 and the second traveling-wave mixer 580 have identical configuration and operational properties, but the input and output signals are different between the first mixer 530 and the second mixer 580. Portions of the second mixer 580 that are similar to corresponding portions of the first mixer 530 are assigned the same reference numbers.

The input signals (the second IF signal 414 and the second LO signal 424) are mixed by the FETS 290a and 290b, and the second RF signal 582 is extracted from the drain terminals 294a and 294b.

For the first traveling-wave filter 530, its input impedance to the first input LO signal 412 is defined by the gate input impedance matching circuit 260. In the gate input impedance matching circuit 260, inductance of the serially connected inductors 262a, 262b, and 262c combine with parasitic source-gate capacitance 241a and 242b to define an input impedance of approximately 50 ohms. The gate input impedance matching circuit 260 behaves similar to a transmission line presenting a relatively constant 50 ohms of impedance to a wide range of frequencies of the first input RF signal 112.

Likewise, in the drain input impedance matching circuit 270, inductance of the serially connected inductors 272a and 272b combine with parasitic drain-source capacitance 243a and 243b to define an input impedance of approximately 50 ohms. The drain input impedance matching circuit 270 behaves similar to a transmission line presenting a relatively constant 50 ohms of impedance to a wide range of frequencies of the first IF signal 422.

Similarity, the second traveling-wave mixer 580 presents relatively constant input impedance to a wide range of frequencies of its incoming signals (the second IF signal 414 and the second local oscillator signal 424) at approximately 50 ohms.

For this reason, the image reject down-conversion mixer 500 is able to operate on a wide range of input IF and LO signals while maintaining a relatively efficient conversion ratio. Thus, the image reject down-conversion mixer 500 is considered to have a wide bandwidth.

Referring again to FIGS. 3 and 4, return loss curve 206 represents return loss property of the IF input 412 port of the traveling-save mixer 530 and return loss property of the IF input 414 port of the traveling-save mixer 580. Return loss curve 208 represents return loss property of the LO input 422 port of the traveling-save mixer 530 and return loss property of the LO input 424 port of the traveling-save mixer 580.

Conversion gain curve 212 represents the conversion gain efficiency of the up-conversion mixer 500. As illustrated by the conversion gain curve 212, the up-conversion mixer 500 has relatively high efficiency (−10 dB or better) for a wide range 213 of input RF frequencies.

The up-conversion mixer 500 is often fabricated as a monolithic microwave integrated circuit (MMIC) except for the first hybrid coupler 410 which is typically fabricated outside the MMIC but connected to the rest of the up-conversion mixer 500 within the MMIC.

VI. CONCLUSION

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. The invention is limited by the claims that follow.

What is claimed is:

1. A up-conversion mixer comprising:
   a first hybrid coupler adapted to receive an input intermediate frequency (IF) signal and to produce a first IF signal (IF1) and a second IF (IF2) signal, the second IF signal being 180 degree off-phase compared to the first IF signal;
   a first traveling-wave single-ended mixer adapted to mix the first IF signal (IF1) and a first local oscillator (LO1) signal to produce a first radio frequency signal (RF1);
   a second traveling-wave single-ended mixer adapted to mix the second IF signal (IF2) and a second local oscillator signal (LO2) to produce a second RF signal (RF2); and
   a second hybrid coupler adapted to combine the first RF signal and the second RF signal to produce an output RF signal;
   such that the first traveling-wave single-ended mixer further comprises:
   a least two switching devices each switching device having a first current terminal, a second current terminal, and a gate terminal, and said switching devices connected in parallel;
   wherein each switching device provides a first parasitic capacitance between its first current terminal and its gate terminal and a second parasitic capacitance between its first current terminal and its second terminal;
   a gate matching circuit including a plurality of gate inductors, serially connected to each other, each gate inductor connected to at least one gate terminal such that inductance of said gate inductors electrically combine with the first parasitic capacitance to present a first input impedance; and a drain matching circuit including a plurality of drain inductors, serially connected to each other, each drain inductor connected to at least one second current terminal such that inductance of said drain inductors electrically combine with the second parasitic capacitance to present a second input impedance;

such that the second traveling-wave single-ended mixer further comprises:

a least two switching devices each switching device having a first current terminal, a second current terminal, and a gate terminal, and said switching devices connected in parallel;

wherein each switching device provides a first parasitic capacitance between its first current terminal and its gate terminal and a second parasitic capacitance between its first current terminal and its second terminal;

a gate matching circuit including a plurality of gate inductors, serially connected to each other, each gate inductor connected to at least one gate terminal such that inductance of said gate inductors electrically combine with the first parasitic capacitance to present a first input impedance; and a drain matching circuit including a plurality of drain inductors, serially connected to each other, each drain inductor connected to at least one second current terminal such that inductance of said drain inductors electrically combine with the second parasitic capacitance to present a second input impedance.

2. The up-conversion mixer recited in claim 1 further comprising a local oscillator hybrid couple adapted to divide a local oscillator signal into the first local oscillator signal provided to said first traveling-wave single-ended mixer and the second local oscillator signal provided to said second traveling-wave single-ended mixer.

3. The up-conversion mixer recited in claim 2 wherein the first local oscillator signal is in quadrature compared to the second local oscillator.

4. The up-conversion mixer recited in claim 1 further comprising a low pass filter adapted to prevent leakage of the output RF signal.

5. The up-conversion mixer recited in claim 4 wherein said low pass filter comprises a filter inductor serially connected to a filter capacitor.

6. The up-conversion mixer recited in claim 5 wherein said switching device is a field effect transistor (FET) having a source terminal, drain terminal, and a gate terminal.

7. An apparatus comprising:

a first hybrid coupler adapted to receive an input intermediate frequency (IF) signal and to produce a first IF signal (IF1) and a second IF (IF2) signal, the second IF signal being at 180 degree off-phase compared to the first IF signal;

a monolithic microwave integrated circuit (MMIC) connected to said first hybrid coupler, said MMIC comprising:

a first traveling-wave single-ended mixer adapted to mix the first IF signal (IF1) and a first local oscillator (LO1) signal to produce a first radio frequency signal (RF1);

a second traveling-wave single-ended mixer adapted to receive the second IF signal (IF2) and a second local oscillator signal (LO2) to produce a second RF signal (RF2); and a second hybrid coupler adapted to combine the first RF signal and the second RF signal to produce an output RF signal;

such that the first traveling-wave single-ended mixer further comprises:

a least two switching devices each switching device having a first current terminal, a second current terminal, and a gate terminal, and said switching devices connected in parallel;

wherein each switching device provides a first parasitic capacitance between its first current terminal and its gate terminal and a second parasitic capacitance between its first current terminal and its second terminal;

a gate matching circuit including a plurality of gate inductors, serially connected to each other, each gate inductor connected to at least one gate terminal such that inductance of said gate inductors electrically combine with the first parasitic capacitance to present a first input impedance; and a drain matching circuit including a plurality of drain inductors, serially connected to each other, each drain inductor connected to at least one second current terminal such that inductance of said drain inductors electrically combine with the second parasitic capacitance to present a second input impedance;

such that the second traveling-wave single-ended mixer further comprises:

a least two switching devices each switching device having a first current terminal, a second current terminal, and a gate terminal, and said switching devices connected in parallel;

wherein each switching device provides a first parasitic capacitance between its first current terminal and its gate terminal and a second parasitic capacitance between its first current terminal and its second terminal;

a gate matching circuit including a plurality of gate inductors, serially connected to each other, each gate inductor connected to at least one gate terminal such that inductance of said gate inductors electrically combine with the first parasitic capacitance to present a first input impedance; and a drain matching circuit including a plurality of drain inductors, serially connected to each other, each drain inductor connected to at least one second current terminal such that inductance of said drain inductors electrically combine with the second parasitic capacitance to present a second input impedance.

8. The apparatus recited in claim 7 further comprising a local oscillator hybrid coupler adapted to divide a local oscillator signal into the first local oscillator signal provided to said first traveling-wave single-ended mixer and the second local oscillator signal provided to said second traveling-wave single-ended mixer.

9. The apparatus recited in claim 8 wherein the first local oscillator signal is in quadrature compared to the second local oscillator.

10. The apparatus recited in claim 7 wherein said first traveling-wave single-ended mixer further comprises a low pass filter adapted to pass the IF signals while blocking the local oscillator signal.

11. The apparatus recited in claim 10 wherein said low pass filter comprises a filter inductor serially connected to a filter capacitor.

12. The apparatus recited in claim 7 wherein said switching device is a field effect transistor (FET) having a source terminal, drain terminal, and a gate terminal.

* * * * *